United States Patent [19]
Araki

[11] Patent Number: 5,288,539
[45] Date of Patent: Feb. 22, 1994

[54] TAB TAPE WITH A PEELING-PREVENTION STRUCTURE FOR THE CONDUCTIVE LAYER

[75] Inventor: Kaoru Araki, Shiga, Japan

[73] Assignee: International Business Machines, Corp., Armonk, N.Y.

[21] Appl. No.: 802,178

[22] Filed: Dec. 4, 1991

[30] Foreign Application Priority Data

Dec. 27, 1990 [JP] Japan .................. 2-415178

[51] Int. Cl.⁵ .............. H01L 21/60; B32B 3/24
[52] U.S. Cl. ............................ 428/136; 428/131;
428/134; 428/138; 428/209; 428/458;
428/473.5; 428/901; 257/666; 257/669;
257/674; 257/773
[58] Field of Search .............. 428/131, 134, 136, 138,
428/209, 458, 473.5, 901; 357/70; 257/666, 669,
674, 773

[56] References Cited

U.S. PATENT DOCUMENTS

| | | | |
|---|---|---|---|
| 4,839,713 | 6/1989 | Teraoka et al. | 357/70 |
| 4,913,930 | 4/1990 | Getson | 428/131 |
| 5,036,380 | 7/1991 | Chase | 357/70 |
| 5,064,706 | 11/1991 | Ueda et al. | 428/131 |
| 5,072,283 | 12/1991 | Bolger | 357/70 |

FOREIGN PATENT DOCUMENTS

| | | |
|---|---|---|
| 0057253 | 10/1981 | European Pat. Off. |
| 0368741 | 11/1989 | European Pat. Off. |
| 0401848 | 6/1990 | European Pat. Off. |
| 2263444 | 11/1991 | Japan |

OTHER PUBLICATIONS

Patent Abstracts of Japan vol. 15, No. 14 (E-1022) Jan. 11, 1991 of JP-A-2263444 (Oct. 26, 1990).

*Primary Examiner*—Ellis P. Robinson
*Assistant Examiner*—William P. Watkins, III
*Attorney, Agent, or Firm*—Bernard Tiegerman

[57] ABSTRACT

The invention involves a TAB (tape automated bonding) tape which includes an electrically conductive layer and a supporting layer. Significantly, the supporting layer includes at least one peeling-prevention slit adjacent a part of the electrically conductive layer which is apt to peel off from the supporting layer when the TAB tape is subjected to stresses, such as thermally-induced stresses and bending stresses.

4 Claims, 2 Drawing Sheets

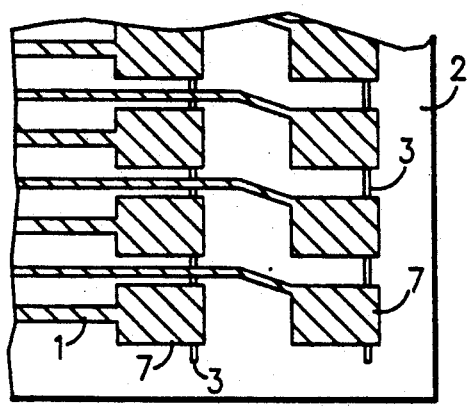
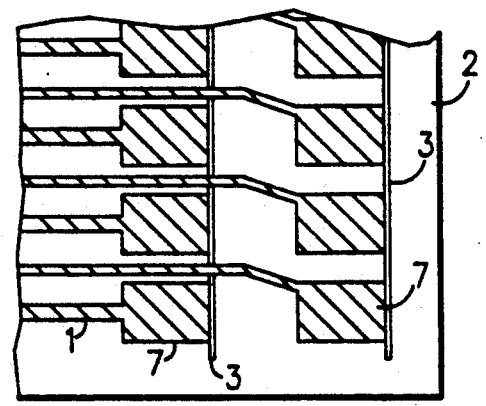
FIG. 2　　　　　　　　FIG. 4
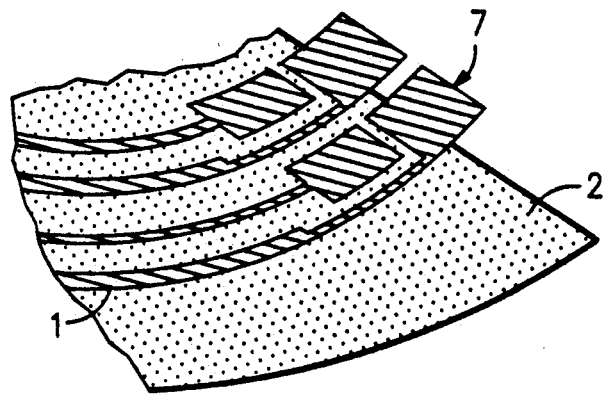
FIG. 7
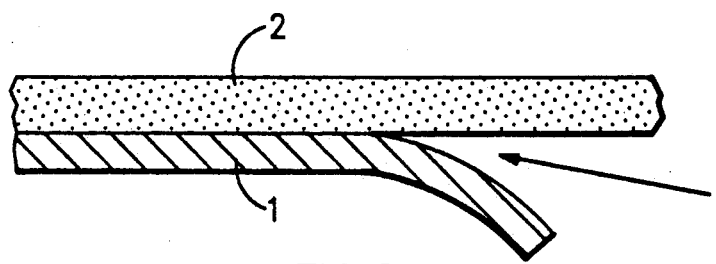
FIG. 8

TAB TAPE WITH A PEELING-PREVENTION STRUCTURE FOR THE CONDUCTIVE LAYER

BACKGROUND OF THE INVENTION

1. Field of the Invention

The invention relates to a TAB (tape automated bonding) tape having a peeling-prevention structure which achieves increased peeling strength at the interface between, for example, an electrically conductive layer of the tape, such as a copper layer, and an electrically insulating, supporting layer of the tape, such as a polyimide layer. This structure serves to prevent peeling of the electrically conductive layer which would otherwise occur as a result of the application of external stresses such as the thermal stress applied during the chip mounting process and the bending stress applied during the lead frame forming process.

2. Description of the Related Art

At present, in conjunction with increased integration of semiconductor integrated circuit devices (hereinafter called semiconductor chips), conventional wire bonding methods for mounting semiconductor chips onto chip packages are being replaced by wireless connection methods such as the combination of TAB (tape automatic bonding) and the flip chip method. The latter connection methods are now increasingly preferred because they achieve both significant reductions in connection time and enhanced connection reliability.

In a semiconductor chip connecting process combining the TAB technique and the flip chip method, a chip having solder bumps is to be mounted onto a TAB tape which includes, for example, two layers. One of these layers is an electrically insulating support layer of, for example, polyimide, while the other layer is an electrically conductive layer of, for example, copper. This copper layer is deposited onto, and bonded to, the polyimide layer using conventional sputtering techniques or electroless plating, without an intermediate bonding layer. The copper layer is also patterned, using conventional photolithographic techniques, to form copper circuit lines, contact pads and test pads. During mounting of the chip, the solder bumps on the chip are brought into contact with copper circuitry, e.g., contact pads or circuit lines, of the TAB tape and heated and reflowed so as to achieve bonding. The bonded chip and TAB tape are washed, and a liquid resin sealant is applied to the chip, and dried. Electrical conductivity tests are then performed on the resin encapsulated chip via the test pads, which are subsequently cut off.

During the above-mentioned reflow process, the heating temperatures employed often exceed 300° C. Because the copper layer and the polyimide layer have significantly different coefficients of thermal expansion, the temperatures employed during the reflow process result in substantial stresses at the interface between the copper layer and the polyimide layer, causing the copper layer to peel off from the polyimide layers. This tendency to peel off is particularly prevalent in TAB tapes where the area of contact between the polyimide layer and the copper layer is large. This tendency is even more prevalent at the tail end of the copper layer containing the test pad section, after the test pad section has peeled, because any peel control exerted on the adjacent portion of the copper layer is lost.

FIG. 7 depicts a conventional TAB tape having a copper layer which has peeled off from the supporting polyimide layer. Numeral 7 represents the test pad section used in the electrical conductivity test. It is formed at the end of copper layer 1. No adhesive layer is interposed between copper layer 1, which includes the test pad section 7, and polyimide layer 2, which supports copper layer 1. As shown, test pad section 7 has warped in a direction separating it from the polyimide layer 2 due, for example, to thermal stress produced at the interface between the two layers.

The test pad section thus peeled off produces problems, as follows:

(1) Contact failures can be caused in the electrical conductivity test process, leading to the entire product being discarded.
(2) In the process of cutting-off the test pads, the cutting mold may be broken because a cut-off remnant of the test pad section, which peeled off from the polyimide layer, may get caught in the cutting mold.
(3) By losing the support of the polyimide layer, the quality of the chip circuit product itself is deteriorated.

The peeling of copper layer 1 from the polyimide layer 2 caused by the difference in the thermal expansion coefficients is further aggravated when an external bending stress is applied to a portion of the copper layer 1, to form a lead frame, as depicted in FIG. 8.

SUMMARY OF THE INVENTION

Accordingly, it is an object of the present invention to provide a TAB tape including at least two material layers having different thermal expansion coefficients and also including a structure which both stops the progress of peeling at the interface between the layers due to a thermal stress produced during high-temperature heating and which prevents peeling.

Another object of the invention is to provide a TAB tape, including an electrically conductive layer and an electrically insulating, supporting layer having a structure which prevents the electrically conductive layer from peeling off the supporting layer when a part of the conductive layer is bent to form a lead frame at a large area of contact between the electrically conductive layer and the supporting layer.

A TAB tape which achieves the above objects, in accordance with the invention, comprises at least two layers including an electrically conductive layer and a supporting layer. Significantly, the inventive TAB tape also includes a slit formed in a part of the supporting layer adjacent a portion of the electrically conductive layer which is apt to peel off from the supporting layer. Such a part of the supporting layer is, for example, adjacent the end section of the electrically conductive layer, containing the test pads. This slit in the supporting layer serves to stop the progress of peeling and prevent peeling.

In a preferred embodiment of the inventive TAB tape, the slit, when viewed in cross-section, has a taper. This is advantageous because it serves to increase adhesive strength.

Preferably, the slit in the supporting layer is formed along the outer edge of the test pad section of the electrically conductive layer or in contact with the test pad section, and thereby serves to prevent contact failure during the electrical conductivity test process.

It must be emphasized that the presence of the slit in the supporting layer prevents peeling off of the copper layer in the relatively large areas of contact between the copper layer and polyimide layer.

BRIEF DESCRIPTION OF THE DRAWINGS

The invention is described with reference to the accompanying drawings, wherein:

FIG. 2 is an enlarged partial plan view showing the test pad portion of the TAB tape of FIG. 1;

FIG. 4 is an enlarged partial plan view of the TAB tape of FIGS. 1-3 showing the test pad section;

FIG. 7 is a partly enlarged sectional view of a conventional TAB tape including a test pad assembly which has undergone peeling; and FIG. 8 is a partly enlarged sectional view of a conventional TAB tape in a condition in which a bending stress has caused peeling of the electrically conductive layer.

DETAILED DESCRIPTION OF THE PREFERRED EMBODIMENTS

Figure 1:
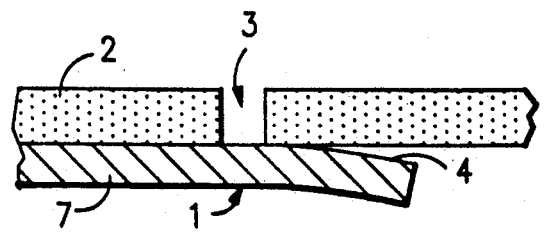
FIG. 1 is a partially enlarged sectional view showing a first preferred embodiment of the TAB tape according to the invention.

FIG. 1 is a partly enlarged sectional view showing a first preferred embodiment of the TAB tape of the present invention. The TAB tape includes at least two layers, i.e., a copper layer 1 and a polyimide layer 2, as in the prior art. Numeral 7 represents the test pad assembly formed on the copper layer 1. This embodiment has parts having relatively large areas of contact between the copper layer 1 and the polyimide layer 2. Consequently, in accordance with the invention, a slit 3 is formed in each part of the polyimide layer adjoining a portion of the copper layer which is apt to peel off using, for example, conventional etching techniques. In particular, as depicted in FIG. 1, a slit 3 is formed in a part of the polyimide layer 2 adjoining the test pad assembly 7 of the copper layer 1.

As depicted in FIG. 2, which is an enlarged partial plan view of the inventive TAB tape of FIG. 1 showing a part of the test pad section of the tape, the slit 3 is, for example, formed just under the test pad assembly 7. In addition, as shown in FIG. 1, in cross-section, the slit 3 has, for example, vertical sidewalls which are readily formed using conventional anisotropic etching techniques, such as reactive ion etching (RIE).

Figure 3:
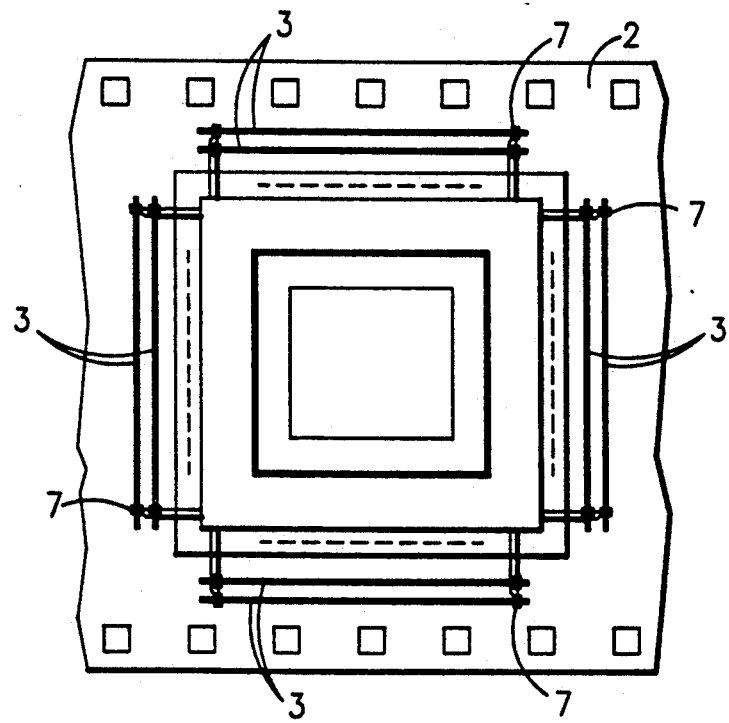
FIG. 3 is a partial plan view of the TAB tape of FIGS. 1 and 2 viewed from the polyimide layer side.

A better view of the position of the slit 3 in the inventive TAB tape is obtained from FIG. 3, which provides a partial plan view of the TAB tape as viewed from the polyimide layer 2.

When peeling occurs at the end section 4 of the test pad assembly 7, as shown in FIG. 1, the part where there is peeling triggers more peeling toward the center of the conductor leads. However, the presence of the slit 3 in the polyimide layer 2 in contact with the copper layer (conductor) 1 serves to stop the progress of the peeling. It should be noted that the cross-sectional profile of the slit 3 need not be vertical, as depicted in FIG. 1, it only being important that there be a slit which satisfactorily stops the progress of peeling.

In another embodiment of the invention, the slit 3 is formed along the outer edge of the test pad assembly 7, as shown in FIG. 4.

This invention prevents peeling of the electrically conductive layer from the supporting layer by providing slits in the supporting layer near where the conductor is apt to peel off and where there is a large area of contact with the conductive layer.

Figure 5:
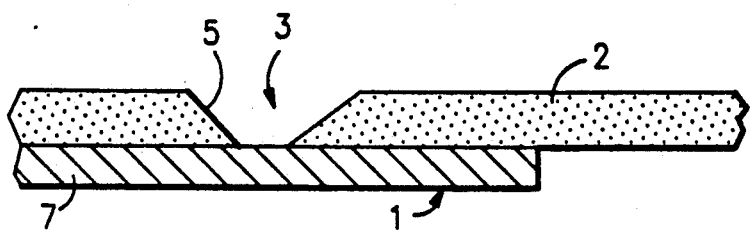
FIG. 5 is a partly enlarged sectional view of a second preferred embodiment of the inventive TAB tape.
Figure 6:
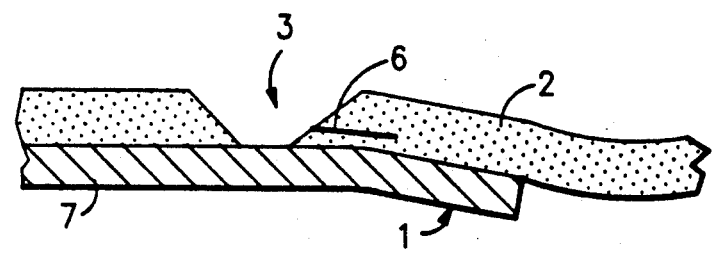
FIG. 6 is a partly enlarged sectional view of the second preferred embodiment of the inventive TAB tape in a condition in which the copper layer of the tape is being subjected to bending.

FIG. 5 is a partly enlarged sectional view showing another embodiment of the TAB tape according to the invention. In this embodiment, as in the above embodiments, a slit 3 is formed in a portion of the polyimide layer 2 adjacent a part of the TAB tape where there is a relatively large area of contact between the copper layer 1 and polyimide layer 2 and where the copper layer 1 is apt to peel off. Significantly, in this embodiment, the slit 3 is formed with tapered sidewalls using conventional isotropic chemical etching techniques, such as plasma etching. Consequently, when the conductor section comprised of copper layer 1 is subjected to bending, the presence of the slit 3 having tapered sidewalls 5 causes the polyimide layer 2 to incline in the direction of the corresponding bending stress and thus incline in the direction of the copper layer. This increases the adhesive strength of the contact section 6 between the copper layer 1 near the slit 3 and the polyimide layer 2, and prevents the separation of the copper layer 1 from the polyimide layer 2.

Table 1 shows a comparison of the peeling strength of the copper layers in TAB tapes. That is, it shows the results, by pulling the end of the copper layer using a pull gauge, of measuring the peeling strength of the copper layer, before and after reflow, on chips mounted on TAB tape by the flip chip method with a slit formed on the taper, and on those using TAB tape without any slit.

According to Table 1, a comparison of peeling strengths before and after reflow shows that the peeling strength of the copper layer drastically drops regardless of the presence of the slit. However, an after reflow comparison of the cases with or without the slit shows that peeling strength in cases with the slit is about twice that of cases without the slit.

Thus, by employing the inventive slit, the peeling strength at the interface of the material layers constituting the inventive TAB tape is substantially increased, the peeling of the electrically conductive layer from the supporting layer is prevented, and the progress of peeling is substantially reduced or entirely stopped.

TABLE 1

| Sample No. | Cu Lead Peeling Strength (g) | | | | | |
|---|---|---|---|---|---|---|
| | 1 | 2 | 3 | 4 | 5 | Average |
| 1-A | 16 | 95 | 112 | 121 | 89 | 106.6 |
| 1-B | 42 | 26 | 28 | 25 | 41 | 32.4 |
| 2-A | 81 | 75 | 75 | 82 | 80 | 78.6 |
| 2-B | 39 | 30 | 25 | 21 | 24 | 27.8 |
| 3-A | 35 | 49 | 37 | 46 | 33 | 40.0 |
| 3-B | 18 | 21 | 17 | 25 | 14 | 19.0 |
| 4-A | 30 | 28 | 41 | 38 | 41 | 35.6 |
| 4-B | 14 | 11 | 16 | 27 | 17 | 17.0 |

Sample Nos. 1, 2: Before reflow
Sample Nos. 3, 4: After reflow
Sample A: With slit
Sample B: Without slit

I claim:

1. A TAB tape, having a peeling - prevention structure, comprising:

a patterned, electrically conductive layer including at least one test pad and at least one circuit line, said at least one circuit line being connected to said at least one test pad; and an electrically insulating, supporting layer which supports said patterned, electrically conductive layer, said supporting layer including a slit which is positioned, at least in part, directly beneath said test pad, wherein aid electrically conductive layer and said supporting layer have different thermal expansion coefficients, and wherein said slit is capable of preventing peeling of said electrically conductive layer from said supporting layer during thermal expansion of said TAB tape.

2. A TAB as claimed in claim 1, wherein said slit is formed to include tapered sidewalls.

3. A TAB tape as claimed in claim 1, wherein said electrically conductive layer is a copper layer.

4. A TAB tape as claimed in claim 1, wherein said supporting layer is a polyimide layer.

* * * * *